US011160371B2

(12) United States Patent
Chen et al.

(10) Patent No.: US 11,160,371 B2
(45) Date of Patent: Nov. 2, 2021

(54) SLIDE RAIL ASSEMBLY AND SLIDE RAIL KIT THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shih-Lung Huang, Kaohsiung (TW); Yi-Syuan Jhao, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/701,176

(22) Filed: Dec. 3, 2019

(65) Prior Publication Data

US 2021/0093083 A1    Apr. 1, 2021

(30) Foreign Application Priority Data

Oct. 1, 2019    (TW) ................................ 108135797

(51) Int. Cl.
| | |
|---|---|
| A47B 88/45 | (2017.01) |
| A47B 88/473 | (2017.01) |
| A47B 88/493 | (2017.01) |
| A47B 88/46 | (2017.01) |
| F16C 29/02 | (2006.01) |

(52) U.S. Cl.
CPC ............. *A47B 88/45* (2017.01); *A47B 88/46* (2017.01); *A47B 88/473* (2017.01); *A47B 88/493* (2017.01); *F16C 29/02* (2013.01)

(58) Field of Classification Search
CPC ....... A47B 88/45; A47B 88/46; A47B 88/473; A47B 88/493; F16C 29/02
USPC ...................... 312/333, 334.1, 334.8, 334.44
See application file for complete search history.

(56) References Cited

U.S. PATENT DOCUMENTS

| | | | | |
|---|---|---|---|---|
| 4,272,139 A | * | 6/1981 | Fler ...................... | A47B 88/493 312/333 |
| 4,469,384 A | * | 9/1984 | Fler ...................... | A47B 88/493 312/333 |
| 5,181,782 A | | 1/1993 | Wojcik | |
| 5,757,109 A | | 5/1998 | Parvin | |
| 6,244,678 B1 | * | 6/2001 | Dopp .................... | A47B 88/467 312/333 |

(Continued)

FOREIGN PATENT DOCUMENTS

| | | |
|---|---|---|
| DE | 30 05 817 A1 | 9/1980 |
| JP | 3080351 U | 9/2001 |
| JP | 3191056 U | 6/2014 |

*Primary Examiner* — James O Hansen
(74) *Attorney, Agent, or Firm* — Winston Hsu

(57) ABSTRACT

A slide rail assembly includes a first rail, a second rail, a third rail, a synchronization device and a contact feature. The second rail is displaceable relative to the first rail. The third rail is displaceable relative to the second rail. The synchronization device is arranged on one of the second rail and the third rail. The contact feature is arranged on the other of the second rail and the third rail. The third rail and the second rail can synchronously displace relative to the first rail through the collaboration between the synchronization device and the contact feature.

12 Claims, 10 Drawing Sheets

(56) References Cited

U.S. PATENT DOCUMENTS

| | | | |
|---|---|---|---|
| 6,789,862 B2 * | 9/2004 | Shih-Long | A47B 88/49 312/334.46 |
| 6,997,529 B1 | 2/2006 | Chen | |
| 7,413,269 B2 | 8/2008 | Chen | |
| 7,458,651 B1 * | 12/2008 | Radke | A47B 88/467 312/333 |
| 9,247,815 B2 | 2/2016 | Chen | |
| 9,538,845 B1 | 1/2017 | Chen | |
| 2003/0209959 A1 * | 11/2003 | Shih-Long | A47B 88/49 312/334.46 |
| 2004/0174103 A1 * | 9/2004 | Yang | A47B 88/467 312/334.46 |
| 2015/0091424 A1 | 4/2015 | Nuckolls | |

\* cited by examiner

SLIDE RAIL ASSEMBLY AND SLIDE RAIL KIT THEREOF

BACKGROUND OF THE INVENTION

1. Field of the Invention

The present invention relates to a slide rail assembly, and more particularly, to a slide rail assembly capable of synchronously displacing two slide rails.

2. Description of the Prior Art

Prior art U.S. Pat. No. 5,181,782A discloses a telescopic slide rail assembly comprising an outer rail, a middle/intermediate rail and an inner rail/drawer section. The middle rail is arranged with a stop block, and the inner rail has a projection. As shown in FIGS. 3-5 of the prior art, when the inner rail is pulled in an opening direction, the inner rail can contact the resilient fingers of the stop block via its projection, so that the middle rail can be pulled out in the opening direction together with the inner rail.

As shown in FIG. 1 or FIG. 7 of the prior art, the ends of the resilient fingers are not connected to each other; that is, the two resilient fingers are designed to be open-ended with a gap therebetween. Therefore, as the ends of the resilient fingers are not connected to each other, the two resilient fingers can bend, warp or break over repeated opening and closing of the slide rails. This may result in the projection of the inner rail being unable to work collaboratively with the two resilient fingers, followed by the middle rail failing to be pulled out in the opening direction together with the inner rail.

Therefore, for manufacturers to satisfy different market demands, the development of a different slide rail product is an important task.

SUMMARY OF THE INVENTION

The present invention relates to a slide rail assembly capable of synchronously displacing two slide rails.

According to an aspect of the present invention, a slide rail assembly comprises a first rail, a second rail, a third rail, a synchronization device, and a contact feature. The second rail is displaceable relative to the first rail; the third rail is displaceable relative to the second rail; the synchronization device is arranged on one of the second rail and the third rail; the contact feature is arranged on the other of the second rail and the third rail; wherein, the third rail and the second rail can synchronously displace relative to the first rail through the synchronization device cooperating with the contact feature; wherein, the synchronization device comprises a first portion and a body portion connected to the first portion, and the first portion is arranged with a first corresponding section and an extending section; wherein, the first corresponding section is connected between the extending section and the body portion.

Preferably, an opening is configured between the first portion and the body portion of the synchronization device.

Preferably, the first portion is further arranged with a second corresponding section, the extending section is connected between the first corresponding section and the second corresponding section, and the second corresponding section is connected between the extending section and the body portion.

Preferably, the synchronization device is made of elastic materials.

Preferably, the contact feature comprises a first contact section; when the third rail at a retracted position displaces in a first direction, the contact feature allows the third rail and the second rail to synchronously displace in the first direction relative to the first rail via the first contact section abutting against the first corresponding section of the synchronization device.

Preferably, the first rail comprises a first blocking portion; when the second rail follows the third rail and synchronously displaces to an extended position in the first direction, the second rail is blocked by the first blocking portion and stays at the extended position, the third rail continues to displace in the first direction relative to the second rail, and the first contact section of the contact feature pushes against the first corresponding section of the synchronization device to deform the synchronization device elastically, allowing the first contact section of the contact feature to cross the first corresponding section of the synchronization device.

Preferably, when the third rail at an open position displaces in a second direction opposite to the first direction, the third rail and the second rail can synchronously displace in the second direction relative to the first rail through the collaboration between the synchronization device and the contact feature.

Preferably, the contact feature further comprises a second contact section; when the third rail at the open position displaces in the second direction, the contact feature allows the third rail and the second rail to synchronously displace in the second direction relative to the first rail via the contact between the second contact section and the second corresponding section of the synchronization device.

Preferably, the first rail comprises a second blocking portion; when the second rail follows the third rail and synchronously displaces to a pre-determined retracted position in the second direction, the second rail is blocked by the second blocking portion and stays at the pre-determined retracted position, the third rail continues to displace in the second direction relative to the second rail, and the second contact section of the contact feature pushes against the second corresponding section of the synchronization device to deform the synchronization device elastically, allowing the second contact section of the contact feature to cross the second corresponding section of the synchronization device.

According to another aspect of the present invention, a slide rail assembly comprises a first rail, a second rail, a third rail, a synchronization device and a contact feature. The second rail is displaceable relative to the first rail; the third rail is displaceable relative to the second rail; the synchronization device is arranged on one of the second rail and the third rail; the contact feature is arranged on the other of the second rail and the third rail; wherein, when the third rail at a retracted position displaces in a first direction, the third rail and the second rail can synchronously displace in the first direction relative to the first rail through the synchronization device cooperating with the contact feature.

According to yet another aspect of the present invention, a slide rail kit comprises a slide rail and a synchronization device. The synchronization device is arranged on the slide rail; wherein the synchronization device comprises a first portion and a body portion, the first portion is arranged with a first corresponding section, a second corresponding section and an extending section connected between the first corresponding section and the second corresponding section; wherein the first corresponding section is connected between the extending section and the body portion; wherein the second corresponding section is connected between the extending section and the body portion; wherein an opening is configured between the first portion of the synchronization device and the body portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
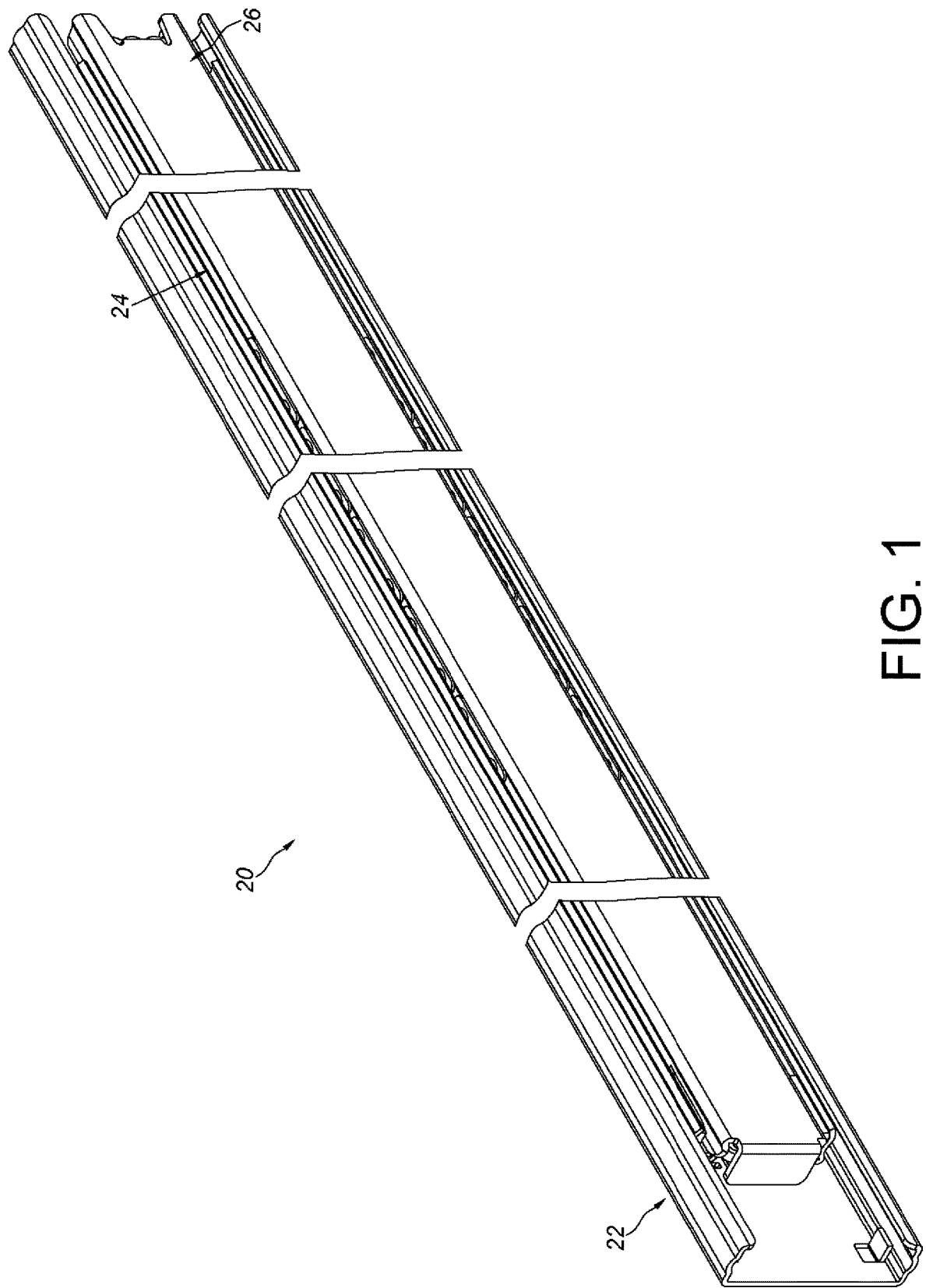
FIG. 1 is a schematic diagram illustrating a slide rail assembly according to an embodiment of the present invention.

As shown in FIG. 1, a slide rail assembly 20 according to an embodiment of the present invention comprises a plurality of slide rails, and a first rail 22, a second rail 24 and a third rail 26 are illustrative of examples herein. The second rail 24 is moveably disposed between the first rail 22 and the third rail 26.

Figure 2:
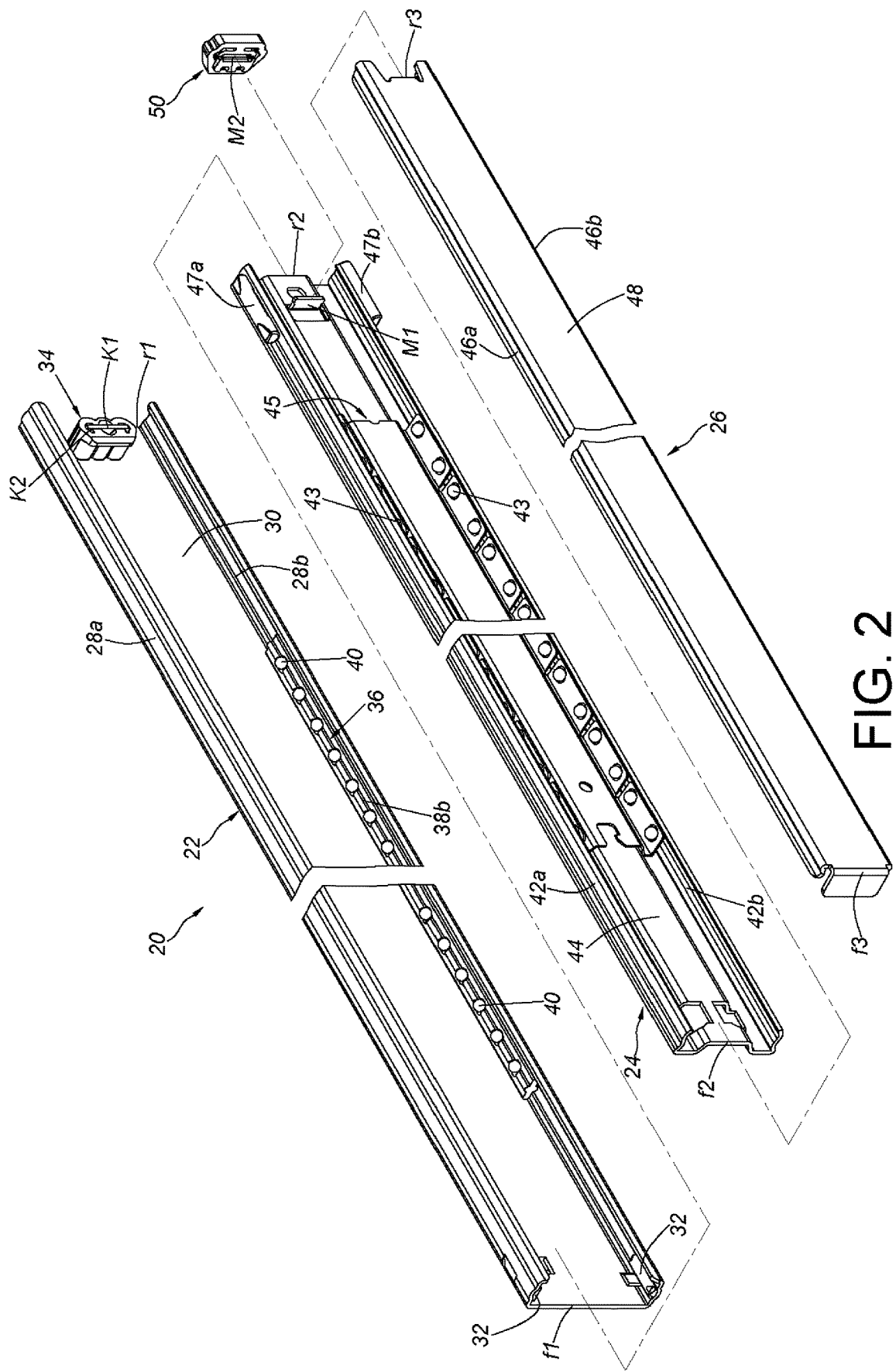
FIG. 2 is an exploded diagram illustrating the slide rail assembly comprising a first rail, a second rail and a third rail according to the embodiment of the present invention.
Figure 3:
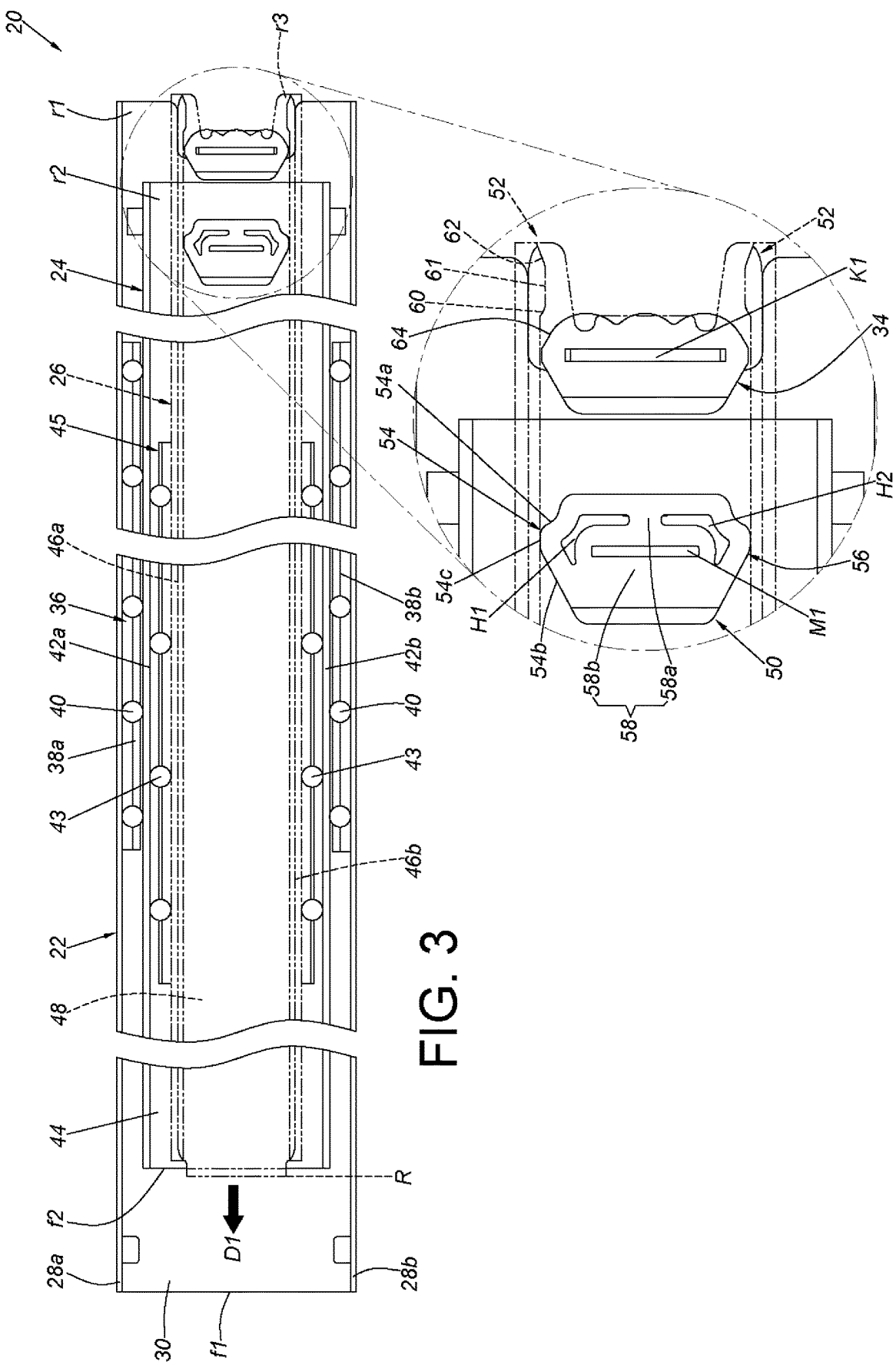
FIG. 3 is a diagram illustrating the slide rail assembly at a retracted status according to the embodiment of the present invention.

As shown in FIGS. 2 and 3, the first rail 22 comprises a first wall 28a, a second wall 28b and a longitudinal wall 30 connected between the first wall 28a and the second wall 28b of the first rail 22. The first wall 28a, the second wall 28b and the longitudinal wall 30 of the first rail 22 collectively define a first passage containing the second rail 24. The first rail 22 comprises a first end portion f1 and a second end portion r1, such as a front end portion and a rear end portion, but the present invention is not limited thereto. Preferably, the first end portion f1 adjacent to the first rail 22 is arranged with at least one first blocking portion 32; one first blocking portion 32 being arranged on the first wall 28a of the first rail 22 and one first blocking portion 32 being arranged the second wall 28b of the first rail 22, and each first blocking portion 32 being a protrusion are illustrative of examples herein. On the other hand, the second end portion r1 adjacent to the first rail 22 is arranged with a second blocking portion 34; wherein, the second blocking portion 34 being arranged as an additional attachment disposed on the second end portion r1 adjacent to the first rail 22, and the attachment being made of elastic materials is illustrative of an example. The longitudinal wall 30 of the first rail 22 comprising a first connecting portion K1, and the attachment being able to connect to the first connecting portion K1 via a second connecting portion K2 is illustrative of an example. The first connecting portion K1 and the second connecting portion K2 can be configured as a set of matching protrusion and indentation (hole or slot), but are not limited thereto in practical applications. For instance, the first connecting portion K1 can be a protrusion to be inserted into a hole or slot that is the second connecting portion K2, so that the second blocking portion 34 can be secured onto the longitudinal wall 30. In other replacement or alternative embodiments, the second blocking portion 34 can be integrally formed on the second end portion r1 adjacent to the first rail 22; therefore, the implementation of the second blocking portion 34 is not limited thereto.

The second rail 24 comprises a first wall 42a, a second wall 42b and a longitudinal wall 44 connected between the first wall 42a and the second wall 42b of the second rail 24. The first wall 42a, the second wall 42b and the longitudinal wall 44 of the second rail 24 collectively define a second passage containing the third rail 26. The second rail 24 comprises a first end portion f2 and a second end portion r2, such as a front end portion and a rear end portion, but is not limited thereto in practical applications. Preferably, the slide rail assembly 20 further comprises a first slide-aiding device 36 moveably disposed between the first rail 22 and the second rail 24; the first slide-aiding device 36 comprising an upper roller strip 38a and a lower roller strip 38b respectively arranged inside the first passage of the first rail 22 and adjacent to the first wall 28a and the second wall 28b of the first rail 22 is illustrative of an example herein. The upper roller strip 38a and the lower roller strip 38b of the first slide-aiding device 36 both comprise a plurality of rollers 40 to assist in the displacement of the second rail 24 and the first rail 22 relative to each other. Wherein, the plurality of rollers 40 such as ball bearings or wheels supports the space between the first wall 28a of the first rail 22 and the first wall 42a of the second rail 24, and the plurality of rollers 40 of the lower roller strip 38b supports the space between the second wall 28b of the first rail 22 and the second wall 42b of the second rail 24.

The third rail 26 comprises a first wall 46a, a second wall 46b and a longitudinal wall 48 connected between the first wall 46a and second wall 46b of the third rail 26. Positions of the first wall 46a, the second wall 46b and the longitudinal wall 48 of the third rail 26 respectively correspond to positions of the first wall 42a, the second wall 42b and the longitudinal wall 44 of the second rail 24. The third rail 26 comprises a first end portion f3 and a second end portion r3, such as a front end portion and a rear end portion, but is not limited thereto in practical applications. Preferably, the slide rail assembly 20 further comprises a second slide-aiding device 45 moveably disposed between the second rail 24 and the third rail 26. The second slide-aiding device 45 comprises a plurality of rollers 43, and the plurality of rollers 43 such as ball bearings or wheels assists in the displacement of the second rail 24 and the third rail 26 relative to each other. Preferably, the second blocking portion 34 of the first rail 22 comprises a guiding feature 64; the guiding feature 64 being a sloped surface or a curved surface is illustrative of an example herein, but is not limited thereto in practical applications.

The slide rail assembly 20 further comprises a synchronization device 50 and a contact feature 52. The synchronization device 50 is arranged on one of the second rail 24 and the third rail 26, and the contact feature 52 (as shown in FIG. 3) is arranged on the other of the second rail 24 and the third rail 26. The synchronization device 50 being arranged on the second rail 24, and the contact feature 52 being arranged on the third rail 26 is illustrative of an example herein, but is not limited thereto in practical applications. Wherein, the synchronization device 50 and the second rail 24 can form a slide rail kit.

The synchronization device 50 can be integrally formed on the second rail 24; or, as shown in the embodiment of the present invention, the synchronization device 50 can be detachably disposed on the second rail 24. More specifically, the longitudinal wall 44 of the second rail 24 comprises a first mounting portion M1, and the synchronization device 50 can be latched on or mounted to the first mounting portion M1 via a second mounting portion M2. Wherein, the first mounting portion M1 and the second mounting portion M2 can be configured as a set of matching protrusion and indentation (hole or slot), but are not limited thereto in practical applications. For instance, the first mounting portion M1 can be a protrusion to be inserted into a hole or slot that is the second mounting portion M2, so that the synchronization device 50 can be secured onto the longitudinal wall 44. Preferably, the synchronization device 50 is an independent component made of elastic materials such as plastic, but is not limited thereto in practical applications. Preferably, the synchronization device 50 comprises a first portion 54, a second portion 56 and a body portion 58 connected between the first portion 54 and the second portion 56 (as shown in FIG. 3). The body portion 58 comprises a first body 58a and a second body 58b connected to the first body 58a. Wherein, the first portion 54 and the second portion 56 have substantially identical structural arrangements, but are not limited thereto in practical applications. Preferably, with respect to the second portion 56, the first portion 54 of the synchronization device 50 is closer to the first wall 42a of the second rail 24; with respect to the first portion 54, the second portion 56 of the synchronization device 50 is closer to the second wall 42b of the second rail 24. Preferably, a first opening H1 is configured between the first portion 54 and the body portion 58. Similarly, a second opening H2 is configured between the second portion 56 and the body portion 58. The first portion 54 of the synchronization device 50 is arranged with a first corresponding section 54a, a second corresponding section 54b and an extending section 54c connected between the first corresponding section 54a and the second corresponding section 54b. Wherein, the first corresponding section 54a is connected between the extending section 54c and (the first body 58a of) the body portion 58; the second corresponding section 54b is connected between the extending section 54c and (the second body 58b of) the body portion 58.

The contact feature 52 (as shown in FIG. 3) comprises a first contact section 60 and a second contact section 62. Preferably, the contact feature 52 further comprises a middle section 61 connected between the first contact section 60 and the second contact section 62. Here, the first wall 46a and the second wall 46b of the third rail 26 both being arranged with a contact feature 52, and the two contact features 52 having substantially identical structural arrangements, are illustrative of examples. Each contact feature 52 functions separately with the first portion 54 and the second portion 56 of the synchronization device 50, and each is substantially functioning in an identical manner. Wherein, a protrusion is illustrative of an example of both contact features 52, but is not limited thereto in practical applications.

As shown in FIG. 3, the slide rail assembly 20 is at a retracted status. Wherein, the second rail 24 is retracted relative to the first rail 22, and the third rail 26 is at a retracted position R relative to the second rail 24. When the third rail 26 is at the retracted position R relative to the second rail 24, the third rail 26 and the contact feature 52 can be blocked by the guiding feature 64 of the second blocking portion 34 of the first rail 22 when displacing in a first direction D1, such that the third rail 26 is prevented from unintentionally leaving the retracted position R in the first direction D1. In other words, the slide rail assembly 20 can be retained at the retracted status. It is worth noting that one of the first contact section 60 of the contact feature 52 and the first corresponding section 54a of the synchronization device 50 comprises a sloped surface or a curved surface. Both are illustrated as a sloped surface or a curved surface as an example herein, but they are not limited thereto in practical applications.

Furthermore, if a force is exerted on the third rail 26 at the retracted position R such that the third rail 26 longitudinally displaces for a distance in the first direction D1 relative to the first rail 22, and the force is large enough to overcome a force required to elastically deform the second blocking portion 34, the contact feature 52 (and the first contact section 60 thereof) of the third rail 26 can contact the guiding feature 64 of the second blocking portion 34. Then, the contact feature 52 can be guided by the guiding feature 64 to cross the second blocking portion 34 in the first direction D1.

Figure 4:
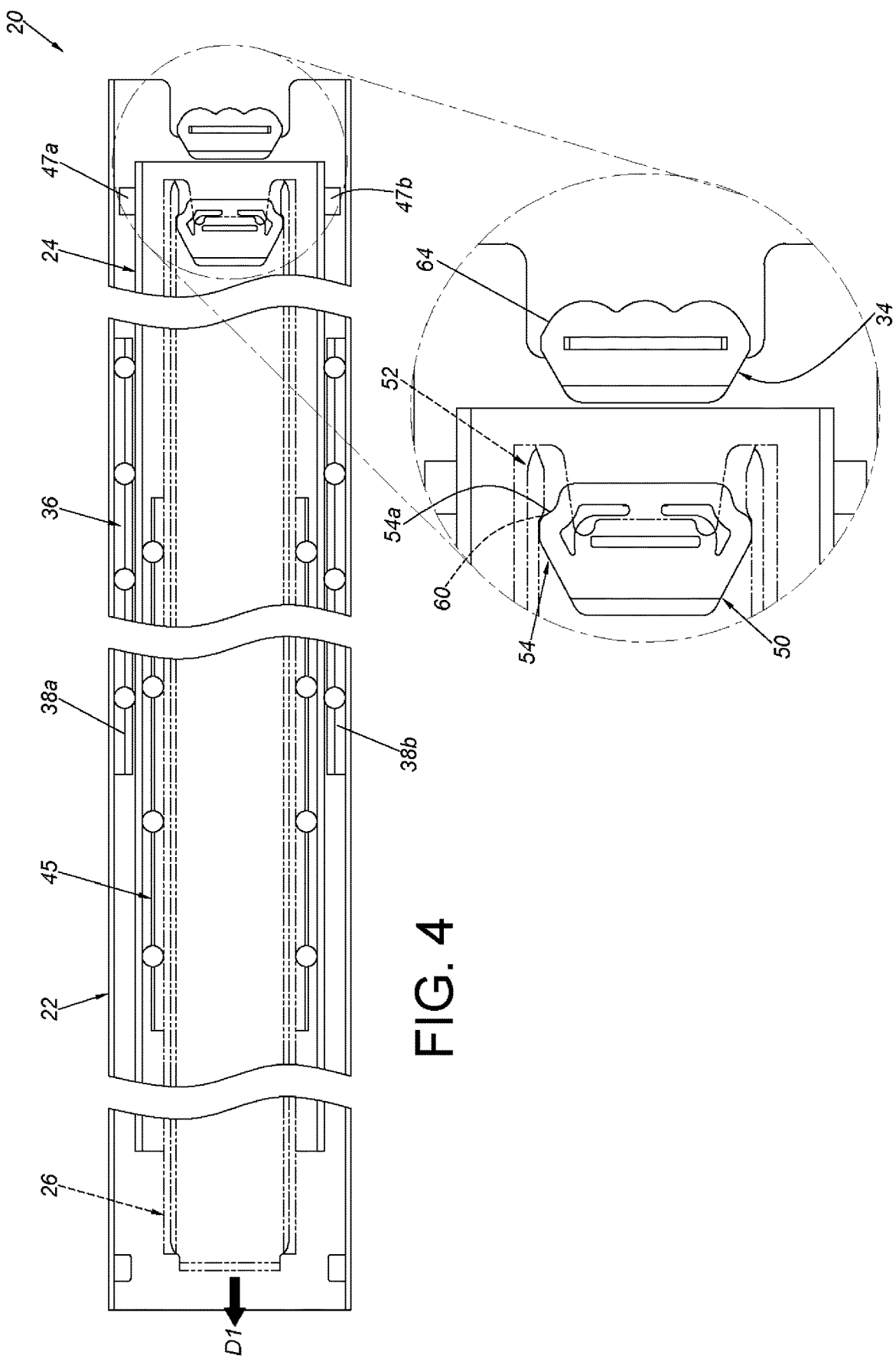
FIG. 4 is a diagram illustrating the second rail of the slide rail assembly retracting relative to the first rail, and the third rail being displaceable in a first direction according to the embodiment of the present invention.

As shown in FIG. 4, when the force described above is exerted on the third rail 26 for the third rail 26 to continue to displace in the first direction D1 relative to the first rail 22, the third rail 26 and the second rail 24 can synchronously displace in the first direction D1 relative to the first rail 22 the synchronization device 50 cooperating with the contact feature 52. More specifically, the contact feature 52 allows the third rail 26 and the second rail 24 to synchronously displace in the first direction D1 via the first contact section 60 abutting against the first corresponding section 54a of the synchronization device 50. At this time, the upper roller strip 38a and the lower roller strip 38b of the first slide-aiding device 36 also displace in the first direction D1 through a slight friction between the upper roller strip 38a, the first wall 28a of the first rail 22 and the first wall 42a of the second rail 24, and through a slight friction between the lower roller strip 38b, the second wall 28b of the first rail 22 and the second wall 42b of the second rail 24. Preferably, the first wall 42a and the second wall 42b of the second rail 24 are arranged with a first pushing portion 47a and a second pushing portion 47b.

Figure 5:
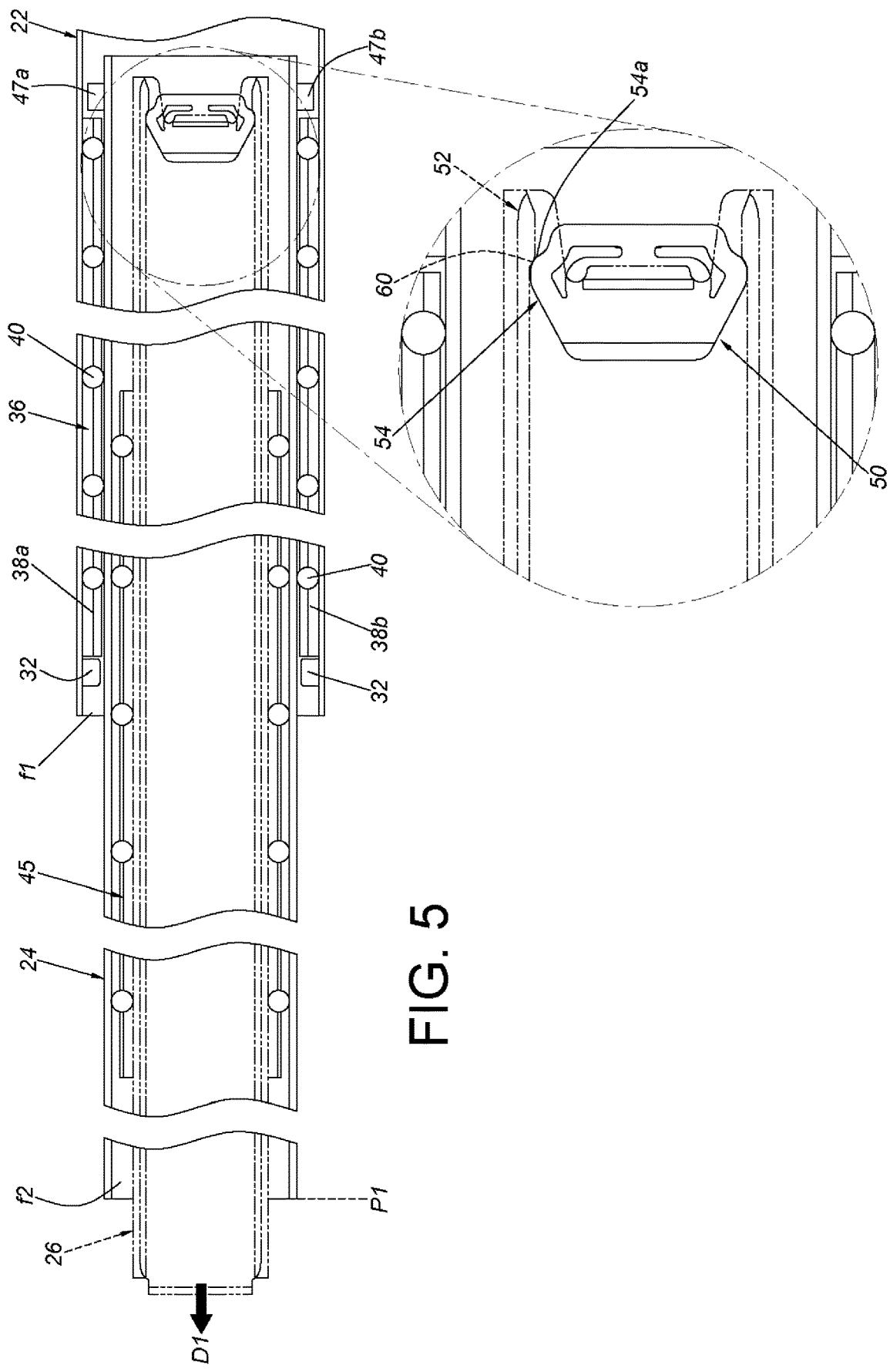
FIG. 5 is a diagram illustrating the third rail and the second rail of the slide rail assembly being displaceable in the first direction relative to the first rail, and the second rail being at an extended position relative to the first rail according to the embodiment of the present invention.

As shown in FIG. 5, when the second rail 24 follows the third rail 26 and synchronously displaces to an extended position P1 in the first direction D1, the second rail 24 is blocked by the first blocking portion 32 of the first rail 22 such that the second rail 24 stays at the extended position P1 relative to the first rail 22. For example, a front end of the upper roller strip 38a and a front end of the lower roller strip 38b of the first slide-aiding device 36 abut the two first blocking portions 32 of the first rail 22 (respectively arranged on the first wall 28a and the second wall 28b), and the first pushing portion 47a and the second pushing portion 47b of the second rail 24 respectively abut a rear end of the upper roller strip 38a and a rear end of the lower roller strip 38b of first slide-aiding device 36. In such a configuration, the second rail 24 can stay at the extended position P1 relative to the first rail 22. In other replacement or alternative embodiments in which the slide rail assembly 20 does not comprise the upper roller strip 38a and the lower roller strip 38b, the second rail 24 can be directly blocked by the two first blocking portions 32 of the first rail 22 contacting the first pushing portion 47a and the second pushing portion 47b. In this manner, the second rail 24 can remain extended and/or extend even farther relative to the first rail 22. Therefore, implementation of such blocking arrangement is not limited thereto in practical applications.

Figure 6:
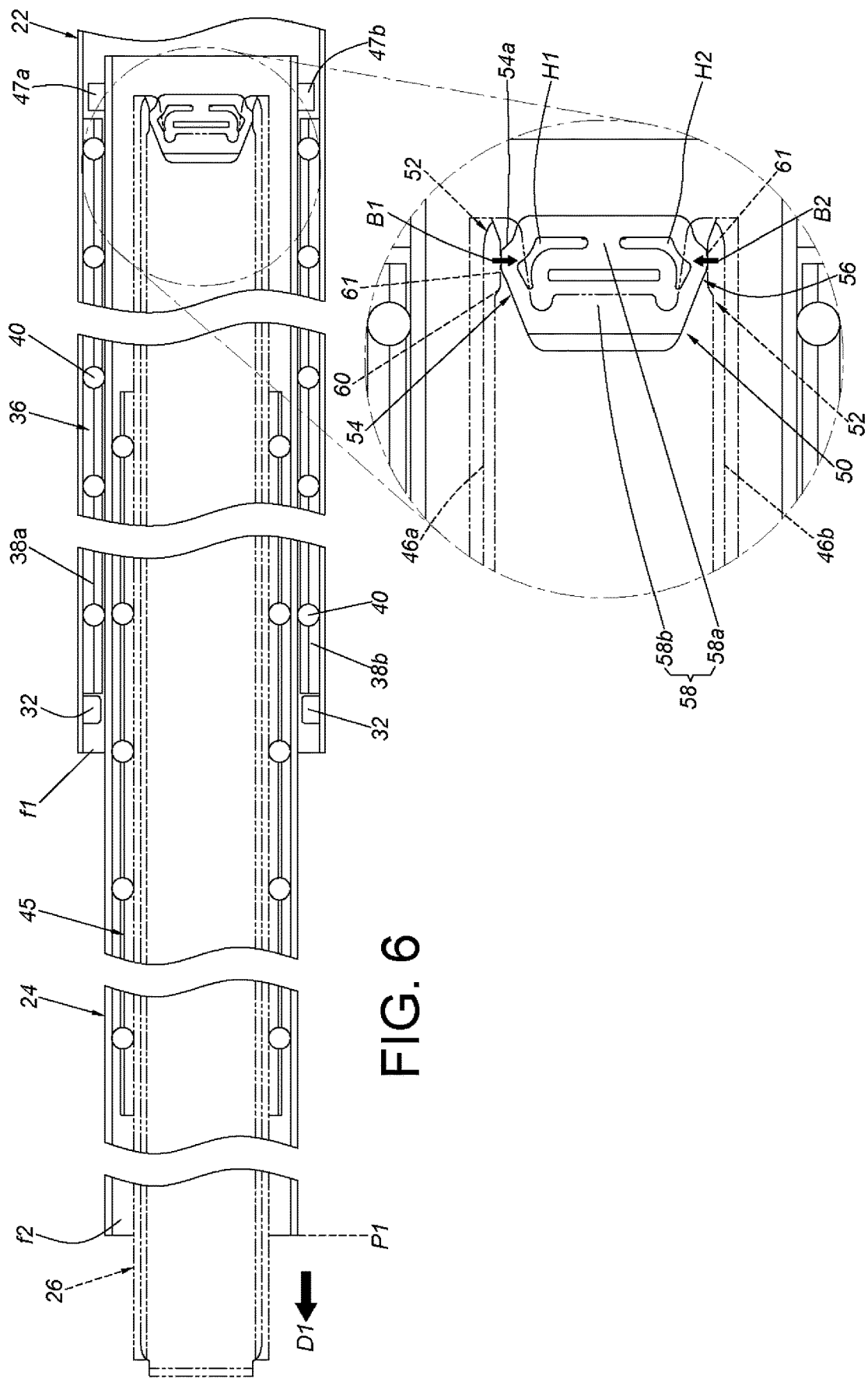
FIG. 6 is a diagram illustrating the third rail displacing in the first direction relative to the second rail that is at the extended position according to the embodiment of the present invention.

As shown in FIGS. 5 and 6, the first contact section 60 of the contact feature 52 and the first corresponding section 54a of the synchronization device 50 in the present embodiment all comprise a sloped surface or a curved surface. At this time, the second rail 24 is blocked by the first rail 22. When the force to continue displacing the third rail 26 in the first direction D1 relative to the second rail 24 that is at the extended position P1 is further increased, the first contact section 60 of the contact feature 52 can push against the first corresponding section 54a of the synchronization device 50 via the sloped surface or the curved surface to deform the synchronization device 50 elastically (as shown in FIG. 6), allowing the first contact section 60 of the contact feature 52 to cross the first corresponding section 54a of the synchronization device 50. Wherein, as shown in FIG. 6, the first portion 54 and the second portion 56 of the synchronization device 50 can be pushed (or compressed) by the middle section 61 of the contact feature 52 of the first wall 46a and the second wall 46b of the third rail 26. Preferably, the first opening H1 is able to assist the first portion 54 of the synchronization device 50 to elastically deform toward the body portion 58 in a first pre-determined direction B1; similarly, the second opening H2 is able to assist the second portion 56 of the synchronization device 50 to elastically deform toward the body portion 58 in a second pre-determined direction B2 opposite to the first predetermined direction B1.

Figure 7:
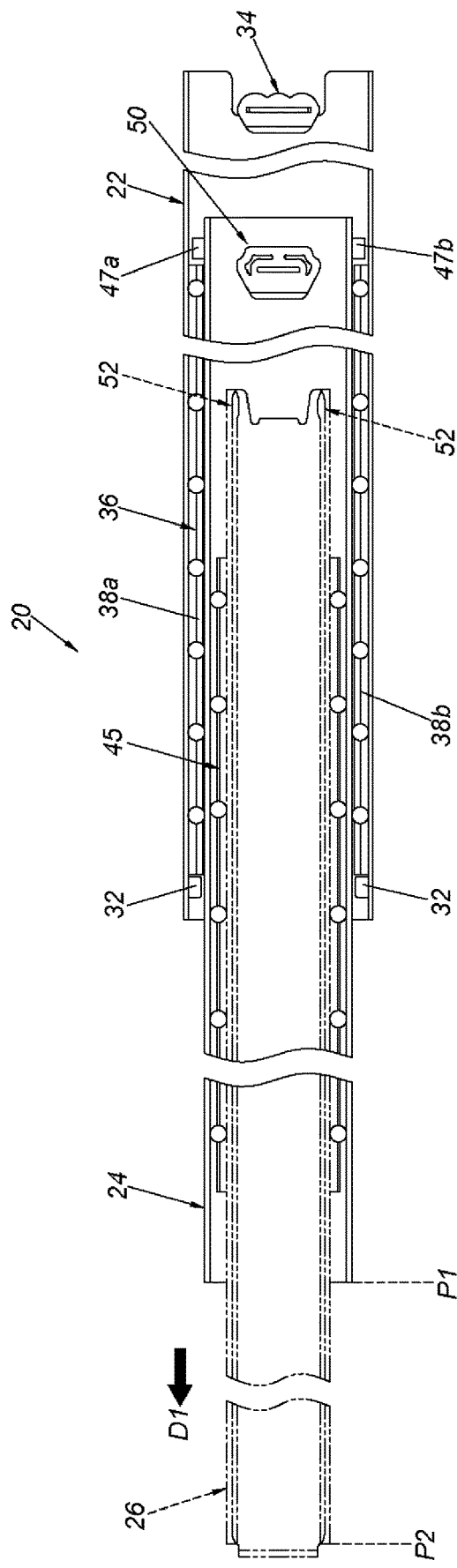
FIG. 7 is a diagram illustrating the slide rail assembly being at an extended status according to the embodiment of the present invention.

As shown in FIG. 7, the slide rail assembly 20 is at an extended status. In particular, after the contact feature 52 crosses the first corresponding section 54a of the synchronization device 50 in the first direction D1, the third rail 26 can displace to an open position P2 relative to the second rail 24 that is at the extended position P1.

Figure 8:
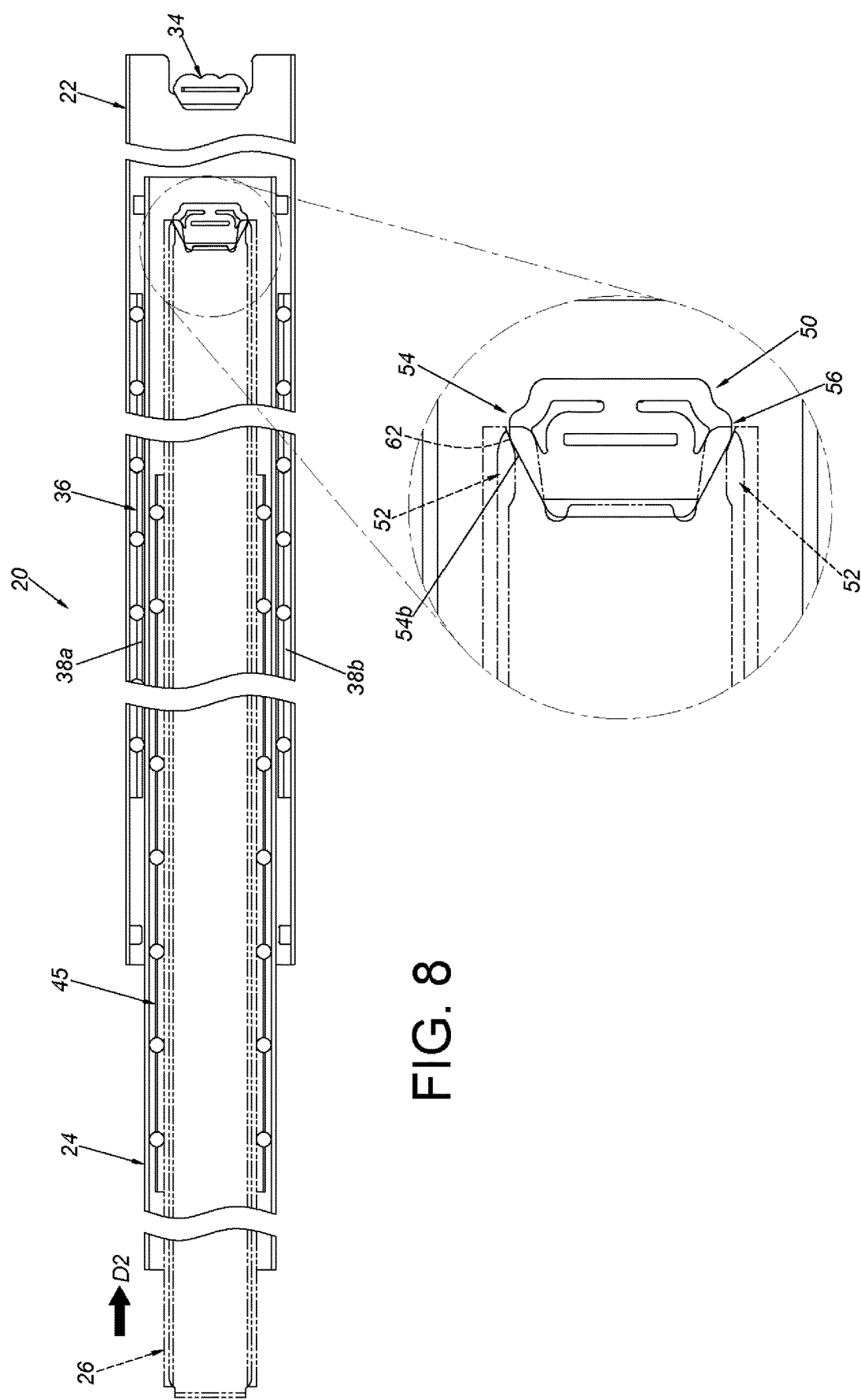
FIG. 8 is a diagram illustrating the third rail of the slide rail assembly displacing in a second direction relative to the second rail that is at the extended position according to the embodiment of the present invention.

As shown in FIG. 8, one of the second contact section 62 of the contact feature 52 and the second corresponding section 54b of the synchronization device 50 comprises a sloped surface or a curved surface. Both are illustrated as a sloped surface or a curved surface as an example herein, but they are not limited thereto in practical applications. Further, when the third rail 26 at the above-mentioned open position P2 displaces in a second direction D2 opposite to the above-mentioned first direction D1, the third rail 26 and the second rail 24 can synchronously displace in the second direction D2 relative to the first rail 22 through the synchronization device 50 cooperating with the contact feature 52. Wherein, when the third rail 26 displaces in the second direction D2 from the above-mentioned open position P2, the contact feature 52 allows the third rail 26 and the second rail 24 to synchronously displace in the second direction D2 via the second contact section 62 abutting against the second corresponding section 54b of the synchronization device 50.

Figure 9:
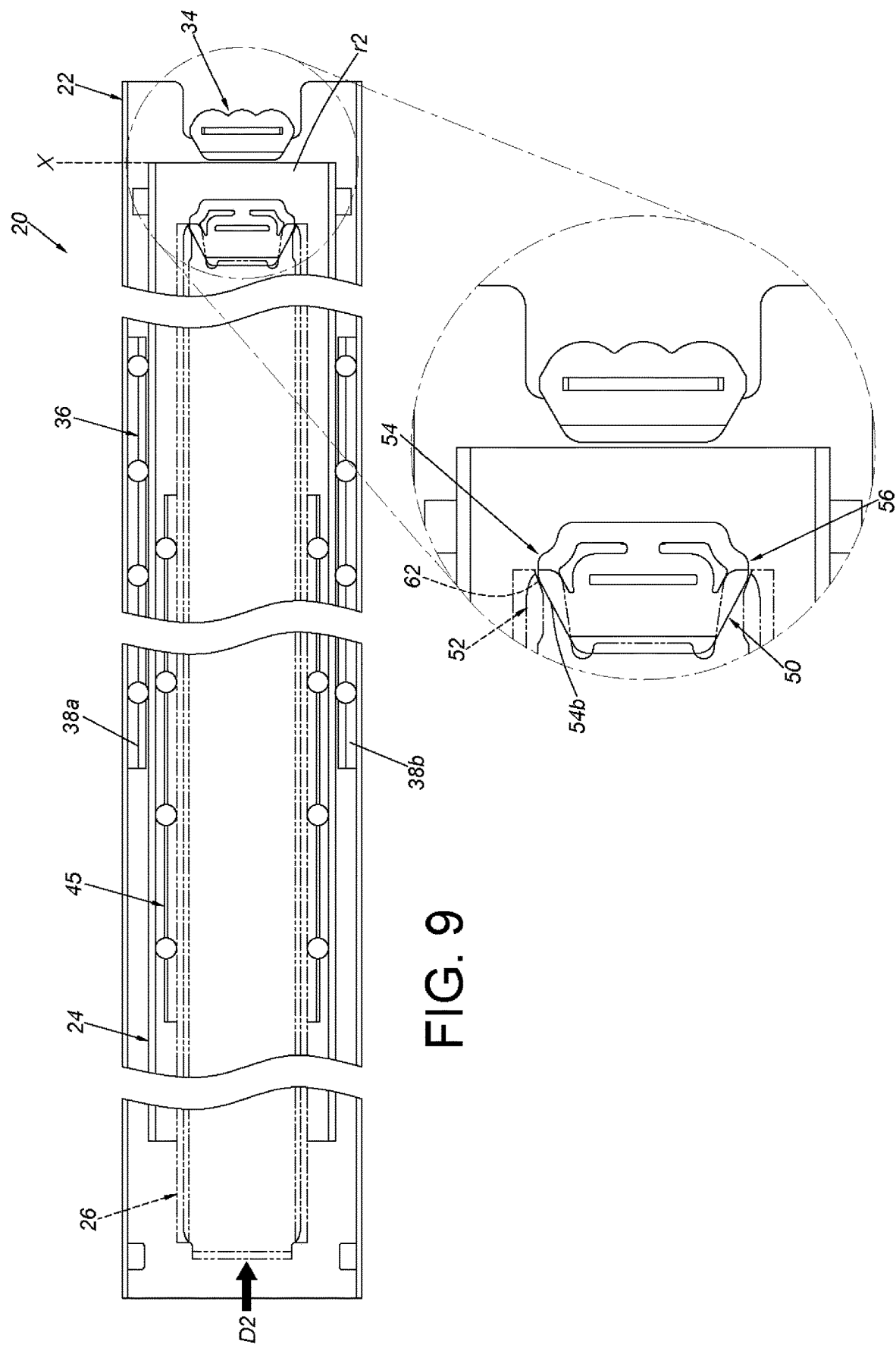
FIG. 9 is a diagram illustrating the third rail and the second rail of the slide rail assembly displacing in the second direction relative to the first rail according to the embodiment of the present invention.

As shown in FIG. 9, when the second rail 24 follows the third rail 26 and synchronously displaces to a pre-determined retracted position X in the second direction D2, a portion of the second rail 24 (such as the second end portion r2 of the second rail 24) is blocked by the second blocking portion 34 of the first rail 22 and the second rail 24 stays at the pre-determined retracted position X.

Figure 10:
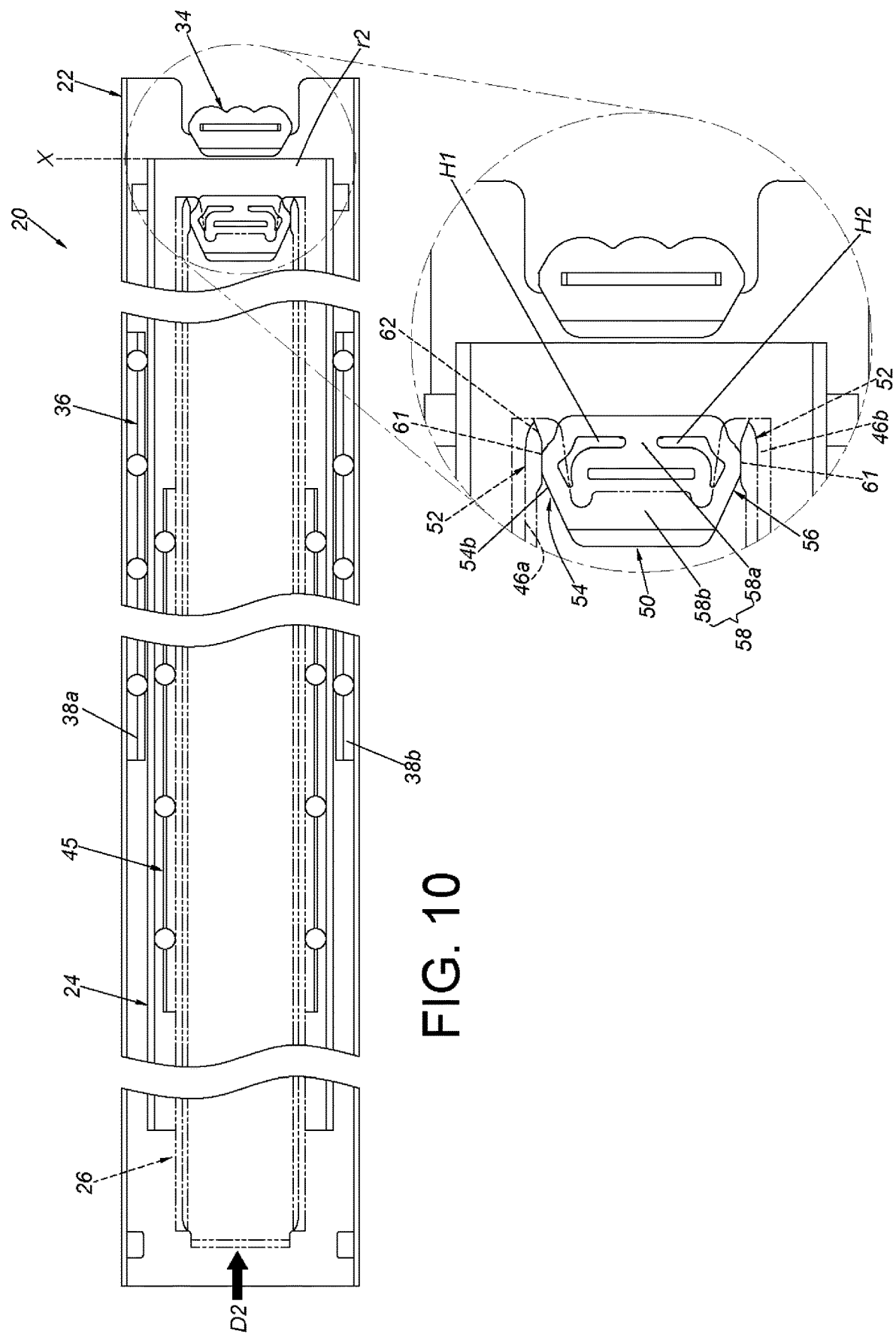
FIG. 10 is a diagram illustrating the second rail of the slide rail assembly retracting relative to the first rail, and the third rail being able to displace in the second direction according to the embodiment of the present invention.

As shown in FIGS. 9 and 10, the second contact section 62 of the contact feature 52 and the second corresponding section 54b of the synchronization device 50 in the present embodiment all comprise a sloped surface or a curved surface. When the third rail 26 continues to displace in the second direction D2 relative to the second rail 24 that is at the pre-determined retracted position X, the second contact section 62 of the contact feature 52 can push against the second corresponding section 54b of the synchronization device 50 via the sloped surface or the curved surface to deform the synchronization device 50 elastically (the principle of elastic deformation is substantially identical to the synchronization device 50 shown in FIG. 6), allowing the second contact section 62 of the contact feature 52 to cross the second corresponding section 54b of the synchronization device 50. Wherein, as shown in FIG. 10, the first portion 54 and the second portion 56 of the synchronization device 50 can be pushed (or compressed) by the middle section 61 of the contact feature 52 of the first wall 46a and the second wall 46b of the third rail 26. Preferably, the first opening H1 is able to assist the first portion 54 of the synchronization device 50 to elastically deform toward the body portion 58 in the above-mentioned first pre-determined direction B1; similarly, the second opening H2 is able to assist the second portion 56 of the synchronization device 50 to elastically deform toward the body portion 58 in the above-mentioned second pre-determined direction B2. After the contact feature 52 crosses the second corresponding section 54b of the synchronization device 50 in the second direction D2, the third rail 26 can displace back to the above-mentioned retracted position R relative to the second rail 24 that is at the pre-determined retracted position X (please also refer to FIG. 3).

It is worth noting that, as shown in FIGS. 3-5 of the embodiment of the present invention, the first corresponding section 54a of the first portion 54 of the synchronization device 50 may comprise a sloped surface or a curved surface. Such sloped or curved surface, with a larger/steeper slope or curvature relative to the second corresponding section 54b, allows the first corresponding section 54a to keep (and stay) in contact with the first contact section 60 during the synchronized movement of the third rail 26 and the second rail 24 in the first direction D1. That is, the larger/steeper slope or curvature of the first corresponding section 54a relative to the second corresponding section 54b would not allow the first contact section 60 to easily cross the first corresponding section 54a in the first direction D1. On the other hand, as shown in FIGS. 9-10 of the embodiment of the present invention, the sloped or curved surface of the second corresponding section 54b, with a smaller/less steep slope or curvature relative to the first corresponding section 54a, allows the first contact section 60 to more easily cross the second corresponding section 54b in the second direction D2.

It can be seen from the aforementioned embodiments that the slide rail assembly of the present invention includes the following advantages:

1. Through the synchronization device 50 cooperating with the contact feature 52, the third rail 26 and the second rail 24 can synchronously displace in the first direction D1 or the second direction D2 relative to the first rail 22.

2. Through the synchronization device 50 cooperating with the contact feature 52, the function of synchronizing the displacement of the third rail 26 and the second rail 24 can be achieved, thereby simplifying an overall design of the structure of the slide rail assembly.

3. The first portion 54 of the synchronization device 50 is arranged with the first corresponding section 54a, the second corresponding section 54b and the extending section 54c connected between the first corresponding section 54a and the second corresponding section 54b. Wherein, the first corresponding section 54a is connected between the extending section 54c and (the first body 58a of) the body portion 58; the second corresponding section 54b is connected between the extending section 54c and (the second body 58b) of the body portion 58. Such configuration increases the structural strength and efficiency of the synchronization device 50 relative to prior arts, so that the function of synchronous displacement of the slide rail assembly 20 can be more reliably achieved.

4. The synchronization device 50 is composed of resilient, elastic or deformable materials. Wherein, the first opening H1 is able to assist the first portion 54 of the synchronization device 50 to elastically deform toward the body portion 58; similarly, the second opening H2 is able to assist the second portion 56 of the synchronization device 50 to elastically deform toward the body portion 58.

5. The synchronization device 50 is detachably disposed on a slide rail (such as the second rail 24). Therefore, the synchronization device 50 can be mounted or installed on the slide rail depending on demands of a user.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail;
a second rail displaceable relative to the first rail;
a third rail displaceable relative to the second rail;
a synchronization device arranged on one of the second rail and the third rail; and
a contact feature arranged on the other of the second rail and the third rail;
wherein the third rail and the second rail can synchronously displace relative to the first rail through the synchronization device cooperating with the contact feature;
wherein the synchronization device comprises a first portion and a body portion, and the first portion is arranged with a first corresponding section and an extending section;
wherein the first corresponding section is connected between the extending section and the body portion;
wherein two ends of the first portion are connected to the body portion, the two ends of the first portion are arranged along a displacement direction of the one of the second rail and the third rail, and the first corresponding section is located at one of the two ends of the first portion;
wherein the first portion is further arranged with a second corresponding section, the extending section is connected between the first corresponding section and the second corresponding section, the second corresponding section is connected between the extending section and the body portion, and the second corresponding section is located at the other one of the two ends of the first portion;
wherein the synchronization device is made of elastic materials;
wherein the contact feature comprises a first contact section; when the third rail at a retracted position displaces in a first direction, the contact feature allows the third rail and the second rail to synchronously displace in the first direction relative to the first rail via the first contact section abutting against the first corresponding section of the synchronization device.

2. The slide rail assembly of claim 1, wherein an opening is configured between the first portion and the body portion of the synchronization device.

3. The slide rail assembly of claim 1, wherein the first rail comprises a first blocking portion; when the second rail follows the third rail and synchronously displaces to an extended position in the first direction, the second rail is blocked by the first blocking portion and stays at the extended position, the third rail continues to displace in the first direction relative to the second rail, and the first contact section of the contact feature pushes against the first corresponding section of the synchronization device to deform the synchronization device elastically, allowing the first contact section of the contact feature to cross the first corresponding section of the synchronization device.

4. The slide rail assembly of claim 3, wherein, when the third rail at an open position displaces in a second direction opposite to the first direction, the third rail and the second rail can synchronously displace in the second direction relative to the first rail through the collaboration between the synchronization device and the contact feature.

5. The slide rail assembly of claim 4, wherein the contact feature further comprises a second contact section; when the third rail at the open position displaces in the second direction, the contact feature allows the third rail and the second rail to synchronously displace in the second direction relative to the first rail via the contact between the second contact section and the second corresponding section of the synchronization device.

6. The slide rail assembly of claim 5, wherein the first rail comprises a second blocking portion; when the second rail follows the third rail and synchronously displaces to a pre-determined retracted position in the second direction, the second rail is blocked by the second blocking portion and stays at the pre-determined retracted position, the third rail continues to displace in the second direction relative to the second rail, and the second contact section of the contact feature pushes against the second corresponding section of the synchronization device to deform the synchronization device elastically, allowing the second contact section of the contact feature to cross the second corresponding section of the synchronization device.

7. A slide rail assembly, comprising:
a first rail;
a second rail displaceable relative to the first rail;
a third rail displaceable relative to the second rail;
a synchronization device arranged on one of the second rail and the third rail, wherein the synchronization device comprises a first portion and a body portion, two ends of the first portion are connected to the body portion, and the two ends of the first portion are arranged along a displacement direction of the one of the second rail and the third rail; and a contact feature arranged on the other of the second rail and the third rail;

wherein, when the third rail at a retracted position displaces in a first direction, the third rail and the second rail can synchronously displace in the first direction relative to the first rail through the synchronization device cooperating with the contact feature;

wherein the synchronization device is arranged on the second rail, and the contact feature is arranged on the third rail;

wherein the synchronization device is detachably disposed on the second rail;

wherein the synchronization device is composed of resilient, elastic or deformable materials;

wherein the contact feature comprises a first contact section, the synchronization device comprises a first corresponding section, the first corresponding section is located at one of the two ends of the first portion, and one of the first contact section and the first corresponding section comprises a sloped surface or a curved surface; when the third rail at the retracted position displaces in the first direction, the contact feature allows the third rail and the second rail to synchronously displace in the first direction relative to the first rail via the contact between the first contact section and the first corresponding section of the synchronization device.

8. The slide rail assembly of claim 7, wherein the first rail comprises a first blocking portion; when the second rail follows the third rail and synchronously displace to an extended position in the first direction, the second rail is blocked by the first blocking portion and stays at the extended position, the third rail continues to displace in the first direction relative to the second rail, and the first contact section of the contact feature pushes against the first corresponding section of the synchronization device through the sloped surface or the curved surface of the first contact section to deform the synchronization device elastically, allowing the first contact section of the contact feature to cross the first corresponding section of the synchronization device.

9. The slide rail assembly of claim 8, wherein, when the third rail at an open position displaces in a second direction opposite to the first direction, the third rail and the second rail can synchronously displace in the second direction relative to the first rail through the synchronization device cooperating with the contact feature.

10. The slide rail assembly of claim 9, wherein the contact feature further comprises a second contact section, the synchronization device further comprises a second corresponding section, the second corresponding section is located at the other one of the two ends of the first portion, and one of the second contact section and the second corresponding section comprises a sloped surface or a curved surface; when the third rail at the open position displaces in the second direction, the contact feature allows the third rail and the second rail to synchronously displace in the second direction relative to the first rail via the contact between the second contact section and the second corresponding section of the synchronization device.

11. The slide rail assembly of claim 10, wherein the first rail comprises a second blocking portion; when the second rail follows the third rail and synchronously displaces to a pre-determined retracted position in the second direction, the second rail is blocked by the second blocking portion and stays at the pre-determined retracted position, the third rail continues to displace in the second direction relative to the second rail, and the second contact section of the contact feature pushes against the second corresponding section of the synchronization device to through the sloped surface or the curved surface to deform the synchronization device elastically, allowing the second contact section of the contact feature to cross the second corresponding section of the synchronization device.

12. The slide rail assembly of claim 11, wherein the synchronization device further comprises a second portion, and the body portion is connected between the first portion and the second portion; the first portion is further arranged with an extending section connected between the first corresponding section and the second corresponding section; the first corresponding section is connected between the extending section and the body portion, and the second corresponding section is connected between the extending section and the body portion; and an opening is configured between the first portion and the body portion.

* * * * *